(12) United States Patent
Asakawa

(10) Patent No.: US 9,688,062 B2
(45) Date of Patent: Jun. 27, 2017

(54) SUBSTRATE PEELING APPARATUS AND METHOD OF FABRICATING DEVICE USING THE SAME

(71) Applicant: Samsung Display Co., Ltd., Yongin, Gyeonggi-Do (KR)

(72) Inventor: Yukinori Asakawa, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/479,715

(22) Filed: Sep. 8, 2014

(65) Prior Publication Data
US 2015/0258767 A1    Sep. 17, 2015

(30) Foreign Application Priority Data

Mar. 12, 2014 (KR) .................... 10-2014-0029128

(51) Int. Cl.
*H01L 21/331* (2006.01)
*B32B 43/00* (2006.01)
(Continued)

(52) U.S. Cl.
CPC ........ *B32B 43/006* (2013.01); *B32B 2327/12* (2013.01); *B32B 2333/04* (2013.01); *B32B 2333/12* (2013.01); *B32B 2363/00* (2013.01); *B32B 2367/00* (2013.01); *B32B 2369/00* (2013.01); *B32B 2375/00* (2013.01); *B32B 2377/00* (2013.01); *B32B 2379/00* (2013.01); *B32B 2379/08* (2013.01); *B32B 2386/00* (2013.01); *B32B 2457/20* (2013.01); *H01L 21/76251* (2013.01); *H01L 21/76254* (2013.01); *H01L 21/76259* (2013.01);
(Continued)

(58) Field of Classification Search
CPC ........ H01L 21/76254; H01L 21/76251; H01L 21/76259; H01L 21/78; B32B 43/006; B32B 2369/00; B32B 2333/04; B32B 2379/08; B32B 2377/00; B32B 2386/00; B32B 2379/00; B32B 2327/12; B32B 2333/12; B32B 2457/20; B32B 2367/00; Y10T 156/1978; Y10T 156/1168; Y10T 156/1189
USPC ........................................... 438/366
See application file for complete search history.

(56) References Cited

U.S. PATENT DOCUMENTS

| 2001/0018949 A1* | 9/2001 | Mizutani et al. ........... 156/233 |
| 2003/0218237 A1* | 11/2003 | Hall et al. .................... 257/675 |
| 2015/0380292 A1* | 12/2015 | Tachioka et al. ............ 257/675 |

FOREIGN PATENT DOCUMENTS

| JP | 08108966 A | 4/1996 |
| JP | 2003163338 A | 6/2003 |

(Continued)

*Primary Examiner* — Phat X Cao
*Assistant Examiner* — Mohammad M Hoque
(74) *Attorney, Agent, or Firm* — Cantor Colburn LLP

(57) ABSTRACT

A method of fabricating a device includes providing a process substrate on a carrier substrate, where the process substrate has a rectangular shape with a pair of long sides and a pair of short sides, providing a device on the process substrate, and continuously peeling the process substrate from the carrier substrate along a curve passing through a starting point which is one of vertices the process substrate, where the curve substantially perpendicularly passes through one of the short sides spaced apart from the starting point.

14 Claims, 9 Drawing Sheets

(51) Int. Cl.
*H01L 21/762* (2006.01)
*H01L 21/78* (2006.01)

(52) U.S. Cl.
CPC ......... *H01L 21/78* (2013.01); *Y10T 156/1168* (2015.01); *Y10T 156/1189* (2015.01); *Y10T 156/1978* (2015.01)

(56) References Cited

FOREIGN PATENT DOCUMENTS

| | | | |
|---|---|---|---|
| JP | 2007185725 A | | 7/2007 |
| JP | 2009162940 A | | 7/2009 |
| JP | 2009184172 A | | 8/2009 |
| JP | 2009186916 A | | 8/2009 |
| JP | 2010018505 A | | 1/2010 |
| JP | 2014118276 A | * | 12/2012 |
| KR | 1020120132488 A | | 12/2012 |
| KR | 1020130021566 A | | 3/2013 |
| WO | WO 2010090147 A1 | * | 8/2010 |

* cited by examiner

SUBSTRATE PEELING APPARATUS AND METHOD OF FABRICATING DEVICE USING THE SAME

This application claims priority to Korean Patent Application No. 10-2014-0029128, filed on Mar. 12, 2014, and all the benefits accruing therefrom under 35 U.S.C. §119, the content of which in its entirety is herein incorporated by reference.

BACKGROUND

1. Field

Exemplary embodiments of the invention relate to a substrate peeling apparatus and a device fabrication method using the substrate peeling apparatus, and in particular, to an apparatus for peeling a process substrate from a carrier substrate and a method of fabricating a device using the apparatus.

2. Description of the Related Art

In general, a display device having a flat-panel display panel, such as a liquid crystal display ("LCD"), a field emission display ("FED"), a plasma display panel ("PDP"), or an organic light-emitting diode ("OLED"), is mainly used in television sets, mobile phones and so forth. Conventionally, the display device is fabricated based on a non-flexible glass substrate. Recently, research has been conducted to realize a flexible display device. For example, some research has been conducted for developing a flexible display device, in which a flexible material (e.g., plastic) is used in place of the non-flexible glass substrate.

SUMMARY

Exemplary embodiments of the invention provide a method of fabricating a device on a flexible substrate with ease. Other exemplary embodiments of the invention provide a substrate peeling apparatus used in the method of fabricating the device.

According to exemplary embodiments of the invention, a method of fabricating a device includes providing a process substrate on a carrier substrate, where the process substrate has a rectangular shape with a pair of long sides and a pair of short sides, providing a device on the process substrate, and continuously peeling the process substrate from the carrier substrate along a curve passing through a starting point which is one of vertices of the process substrate, where the curve substantially perpendicularly passes through one of the short sides spaced apart from the starting point.

In an exemplary embodiment, a boundary of a peeled region of the carrier substrate during the peeling of the process substrate from the carrier substrate may be substantially perpendicular to the curve.

In an exemplary embodiment, the curve may be a part of a circle.

In an exemplary embodiment, when the vertices of the process substrate is located at positions (0, 0), (a, 0), (b, 0) and (a, b), respectively, in an xy-coordinate system, and the starting point is located at the position (0, 0) in the xy-coordinate system, the curve may be given by the following equation: $(x-a)^2+(y+a)^2=2a^2$ where a>b and $0 \le x \le a$.

In an exemplary embodiment, the curve may be a part of an ellipse.

In an exemplary embodiment, when, in an xy-coordinate system, the vertices of the process substrate is located at positions (0, 0), (a, 0), (b, 0) and (a, b), respectively, and the starting point is located at the position (0, 0), the curve may be given by the following equation:

$$\frac{(x-a)^2}{p^2} + \frac{(y+a)^2}{q^2} = 2a^2,$$

where $p \ne 0$, $q \ne 0$, $p \ne q$, $0 \le x \le a$, and $$\frac{q}{q} < \sqrt{\frac{a+b}{a}}$$

for $$\frac{q}{p} > 1.$$

In an exemplary embodiment, each of the process and carrier substrates may include glass or a polymer.

In an exemplary embodiment, the polymer may include at least one of polyethylene terephthalate ("PET"), polyethylene naphthalate ("PEN"), poly(ether sulfone) ("PES"), polycarbonate ("PC"), polysulfone, phenolic resin, epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl (methacrylates)), aliphatic or cyclic polyolefin, polyarylate, polyetherimide, polyimide, fluoropolymer such as polytetrafluoroethylene ("PTFE"), poly(ehterether ketone), poly (ether ketone), poly(ethylene tetrafluoroethylene) fluoropolymer, poly(methyl methacrylate), or acrylate/methacrylate copolymers.

In an exemplary embodiment, the process substrate may have a thickness of about 0.3 millimeter (mm) or less, and the carrier substrate may have a thickness of about 0.3 mm or greater.

In an exemplary embodiment, the method may further include separating a portion of the process substrate near the starting point from the carrier substrate, before the continuous peeling of the process substrate from the carrier substrate.

According to exemplary embodiments of the invention, an apparatus for peeling a process substrate from a carrier substrate is provided. The process substrate may be in a shape of a rectangle with a pair of long sides and a pair of short sides. The peeling apparatus may include a holder part grasping one of vertices of the process substrate, and an operator part moving the holder part along a curve passing through a starting point, which is the vertex grasped by the holder part, and perpendicularly crossing one of the short sides spaced apart from the starting point.

In an exemplary embodiment, the holder part may be moved in such a way that a boundary of a peeled region during peeling the process substrate from the carrier substrate may be perpendicular to the curve.

In an exemplary embodiment, the curve may be in a shape of a part of a circle.

In an exemplary embodiment, when in an xy-coordinate system, the vertices of the process substrate is located at positions (0, 0), (a, 0), (b, 0) and (a, b), respectively, and the starting point is located at the position (0, 0), the curve may be given by an equation $(x-a)^2+(y+a)^2=2a^2$, where a>b and $0 \le x \le a$.

In exemplary embodiments, the curve may be in a shape of a part of an ellipse.

In an exemplary embodiment, when, in an xy-coordinate system, the vertices of the process substrate is located at positions (0, 0), (a, 0), (b, 0) and (a, b), respectively, and the starting point is located at the position (0, 0), the curve may be given by the following equation:

$$\frac{(x-a)^2}{p^2} + \frac{(y+a)^2}{q^2} = 2a^2,$$

where p≠0, q≠0, p≠q, 0≤x≤a, and $$\frac{q}{q} < \sqrt{\frac{a+b}{a}}$$

for $$\frac{q}{p} > 1.$$

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
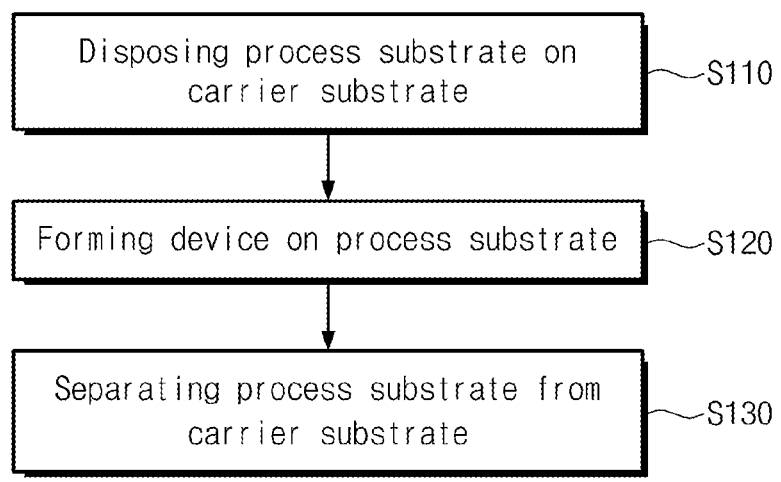
FIG. 1 is a flow chart illustrating an exemplary embodiment of a method of fabricating a device according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which exemplary embodiments of the inventions belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in further detail with reference to the accompanying drawings.

Figure 2A:
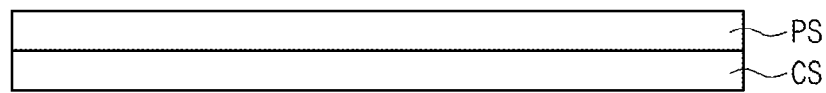
FIGS. 2A through 2C are sectional views illustrating an exemplary embodiment of the method of fabricating a device according to the invention.
Figure 2B:
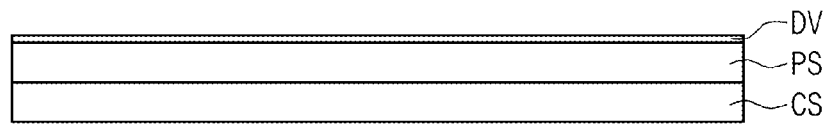
Figure 2C:
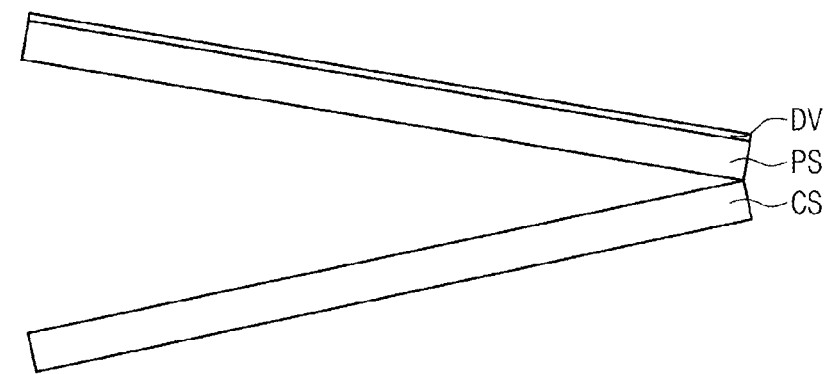

FIG. 1 is a flow chart illustrating an exemplary embodiment of a method of fabricating a device according to the invention. FIGS. 2A through 2C are sectional views illustrating an exemplary embodiment of the method of fabricating a device according to the invention. Hereinafter, an exemplary embodiment of a device fabrication method according to the invention will be described with reference to FIGS. 1 and 2A through 2C.

Referring to FIG. 1, according to exemplary embodiments of the invention, a device may be fabricated on a process substrate. In one exemplary embodiment, for example, the fabrication of the device may include providing, e.g., disposing, a process substrate on a carrier substrate (S110), providing, e.g., forming, the device on the process substrate (S120), and separating the process substrate from the carrier substrate (S130).

Referring to FIGS. 1 and 2A, a process substrate PS is provided, e.g., disposed, on a carrier substrate CS. The process substrate PS may be laid on a top surface of the carrier substrate CS. In an exemplary embodiment, the process substrate PS may be independently prepared from the carrier substrate CS and may be disposed on the carrier substrate CS, but not being limited thereto. In an alternative exemplary embodiment, the process substrate PS may be directly formed on the carrier substrate CS. In an exemplary embodiment, a holder (not shown) (e.g., clips) may be provided on the carrier substrate CS to hold the process substrate PS, and the process substrate PS may be fixed on the carrier substrate CS by the holder.

The process substrate PS may be provided in the form of plate having two opposite surfaces, and devices may be formed on one (e.g., a top surface) of two opposite surface of the process substrate PS. When viewed in a plan view, a shape of the process substrate PS may be variously changed. In exemplary embodiments, the process substrate PS may be in a shape of a rectangle having a pair of long sides and a pair of short sides. In an alternative exemplary embodiment, the process substrate PS may have a variously-changed shape, for example, a polygonal shape such as tetragon, rectangle, parallelogram, and so forth. In such an embodiment, a portion (e.g., an edge) of the polygonal shape may have a curved shaped. In another alternative exemplary embodiment, the process substrate may be provided to have an irregular shape.

A thickness of the process substrate PS may be variously changed based on the purpose of the usage of the device fabricated on the process substrate PS. In one exemplary embodiment, for example, the process substrate PS may have a substantially thin thickness (for example, a thickness of about 0.3 millimeter (mm) or less) to allow a thickness of a display device including the process substrate PS to be reduced.

In an exemplary embodiment, the process substrate PS is a hard substrate. In an alternative exemplary embodiment, the process substrate PS may be a soft substrate having at least a flexible portion. In one exemplary embodiment, for example, the process substrate PS may be configured in such a way that the whole region thereof has flexibility. In an alternative exemplary embodiment, a portion of the process substrate PS has a predetermined flexibility, and the other does not have the flexibility. In such an embodiment, the process substrate PS may have a soft region with flexibility and a hard region with no flexibility. Further, with regard to the soft and hard regions, the terms "flexibility", "no flexibility", "soft", and "rigid" will be used to represent relatively a property of the process substrate PS. In one exemplary embodiment, for example, the term "no flexibility" or "hard" may be used to express a perfectly rigid state or a case having somewhat flexibility (e.g., being more rigid compared with the soft region).

The process substrate PS may include or be formed of glass, quartz, organic polymer, organic/inorganic polymer compound, or fiber-reinforced plastic. In one exemplary embodiment, for example, the process substrate PS may include glass.

In exemplary embodiments, the polymer material may include at least one of polyethylene terephthalate ("PET"), polyethylene naphthalate ("PEN"), poly(ether sulfone) ("PES"), polycarbonate ("PC"), polysulfone, phenolic resin, epoxy resin, polyester, polyimide, polyetherester, polyetheramide, cellulose acetate, aliphatic polyurethanes, polyacrylonitrile, polytetrafluoroethylenes, polyvinylidene fluorides, poly(methyl(methacrylates)), aliphatic or cyclic polyolefin, polyarylate, polyetherimide, polyimide, fluoropolymer such as polytetrafluoroethylene ("PTFE"), poly(ehterether ketone), poly(ether ketone), poly(ethylene tetrafluoroethylene) fluoropolymer, poly(methyl methacrylate), or acrylate/methacrylate copolymers.

In an exemplary embodiment, the carrier substrate CS may be configured to support the process substrate PS, to be provided in a subsequent process, and may have an area that is equal to or larger than an area of the process substrate PS. In an alternative exemplary embodiment, the carrier substrate CS may have an area that is smaller than the area of the process substrate PS. In such an embodiment of the invention, the area of the carrier substrate CS may not be limited to a specific value, but the area of the carrier substrate CS may be variously selected to allow the carrier substrate CS to stably hold and support the process substrate PS.

The carrier substrate CS may include or be formed of glass, quartz, organic polymer, organic/inorganic polymer compound, or fiber-reinforced plastic. In one exemplary embodiment, for example, the carrier substrate CS may be formed of glass. The carrier substrate CS may be configured to have a thickness greater than a predetermined thickness that allows the carrier substrate CS to support the process substrate PS (e.g., a thickness of about 0.3 mm or greater).

In exemplary embodiments, the carrier substrate CS may be provided in the form of the hard substrate. However, in other exemplary embodiments, the carrier substrate CS may be provided in the form of the soft substrate, at least a portion of which has the flexibility depending on, for example, a process condition.

In an exemplary embodiment, the process substrate PS may be disposed or provided on the carrier substrate CS in such a way that the process substrate PS is in physical contact with the carrier substrate CS, but is not chemically coupled with the carrier substrate CS (for example, through the covalent bond). In such an embodiment, an additional layer such as any adhesive or sticky layer, except for an air layer, may not be interposed between the process substrate PS and the carrier substrate CS. Accordingly, in such an embodiment, separation of the process substrate PS from the carrier substrate CS may be effectively or efficiently performed without any damage to the process and carrier substrates PS and CS, using an external force.

In an exemplary embodiment, a debonding layer (not shown) may be provided on one of two opposite surfaces of the process and carrier substrates PS and CS and the debonding layer allows easy separation between the process and carrier substrates PS and CS. The debonding layer may include or be formed of a material, whose hydrophobicity is higher than hydrophobicity of the process substrate. In an exemplary embodiment, the debonding layer may be formed of an inorganic or polymer resin thin-film. In an exemplary embodiment, the debonding layer may be, for example, a metal oxide layer or a silane compound layer. In such an embodiment, the silane compound layer may be provided in the form of a self-assembled monolayer.

Referring to FIGS. 1 and 2B, a device DV is provided, e.g., formed, on the process substrate PS.

Various types of device may be provided on the process substrate PS as the device DV. In one exemplary embodiment, for example, the device DV may include a memory device or a plurality of pixels.

A process of providing the device DV is performed to the process substrate PS provided on the carrier substrate CS. In one exemplary embodiment, for example, processes of loading or unloading the process substrate PS may be performed in the state that the process substrate PS is disposed on the carrier substrate CS In an exemplary embodiment, the device DV may be a plurality of pixels for a display device. In such an embodiment, each pixel may include a wiring, a thin-film transistor connected to the wiring, an electrode connected to the thin-film transistor, and an image display layer controlled by the electrode.

The wiring may include a plurality of gate lines and a plurality of data lines crossing the gate lines.

The thin-film transistor may be provided in plural to be operated in a passive matrix mode or an active matrix mode. In an exemplary embodiment where a plurality of thin film transistors operates in the active matrix mode, each of the thin-film transistors may be connected to a corresponding one of the gate lines and a corresponding one of the data lines. The electrode may be provided in plural, thereby connected to corresponding thin film transistor.

Although not shown, each thin-film transistor may include a gate electrode, an active layer, a source electrode, and a drain electrode. The gate electrode may diverge from a corresponding one of the gate lines. The active layer may be formed in such a way that it is electrically separated or insulated from the gate electrode, and the source and drain electrodes may be spaced apart from each other on the active layer to expose a portion of the active layer. The source electrode may diverge from a corresponding one of the data lines.

The image display layer may include a liquid crystal layer, an electrophoresis layer, an electro-wetting layer, or an organic light emitting layer, based on a type of the display device. Operation of the image display layer may be performed in response to voltages applied to the electrode(s).

Referring to FIGS. 1 and 2C, the process substrate PS may be separated from the carrier substrate CS. The separation between the process and carrier substrates PS and CS may include peeling the process substrate PS from the carrier substrate CS or peel the carrier substrate CS from the process substrate PS. Hereinafter, for convenience of description, an exemplary embodiment, in which the process substrate PS is peeled from the carrier substrate CS, will be described in detail.

Figure 3:
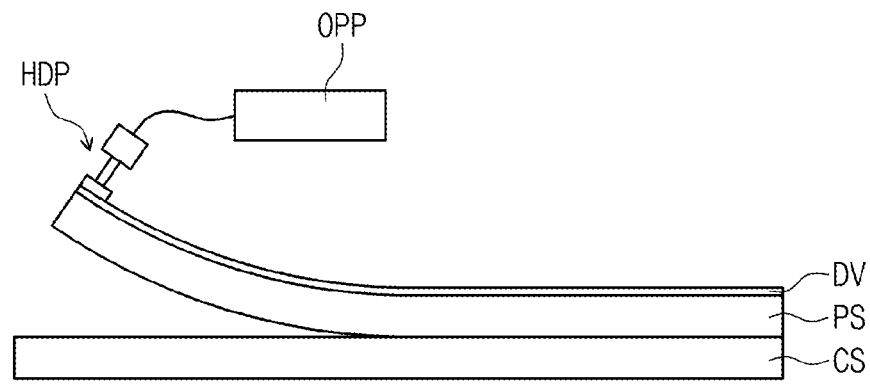
FIG. 3 is a schematic diagram illustrating an exemplary embodiment of a process of peeling a process substrate from a carrier substrate using a process substrate peeling apparatus, according to the invention.

FIG. 3 is a schematic diagram illustrating an exemplary embodiment of a process of peeling a process substrate from a carrier substrate using a process substrate peeling apparatus, according to the invention.

Referring to FIG. 3, an exemplary embodiment of an apparatus for peeling the process substrate (hereinafter a peeling apparatus) includes a holder part HDP, which is configured to grasp one of vertices of the process substrate PS, and an operator part OPP which controls the holder part HDP.

The holder part HDP is configured to grasp a portion (e.g., one of the vertices) of the process substrate PS. The operator part OPP is configured to move the holder part HDP along a predetermined direction with a predetermined speed. In an exemplary embodiment, the process of peeling the process substrate PS from the carrier substrate CS may include moving the holder part HDP based on the control of the operator part OPP.

The process substrate PS may be gradually peeled from the carrier substrate CS. In one exemplary embodiment, for example, a region separated by the peeling process may become gradually enlarged from a portion of the process substrate PS (hereinafter, a starting point) to the whole process substrate PS.

In an exemplary embodiment, the starting point may be positioned at one of vertices of the process substrate PS that is grasped by the holder part HDP. The operator part OPP may move the holder part HDP grasping the vertex of the process substrate PS toward a predetermined direction, and thus, the process substrate PS may be peeled from the carrier substrate CS. The moving direction of the holder part HDP will be described later in greater detail.

In an exemplary embodiment, an additional process of separating a portion of the process substrate PS from the carrier substrate CS may be further performed before the process of gradually peeling the process substrate PS from the carrier substrate CS.

The additional separation process may be performed in various ways. In one exemplary embodiment, for example, the additional separation step may include inserting a blade into an interface between the process substrate PS and the carrier substrate CS to form a gap between the process substrate PS and the carrier substrate CS, and then exerting an outward pulling force to at least one of the process substrate PS and the carrier substrate CS.

According to exemplary embodiments of the invention, as long as the afore-described functions can be achieved by the holder part HDP and the operator part OPP, the shapes of the holder part HDP and the operator part OPP may be variously modified.

Figure 4:
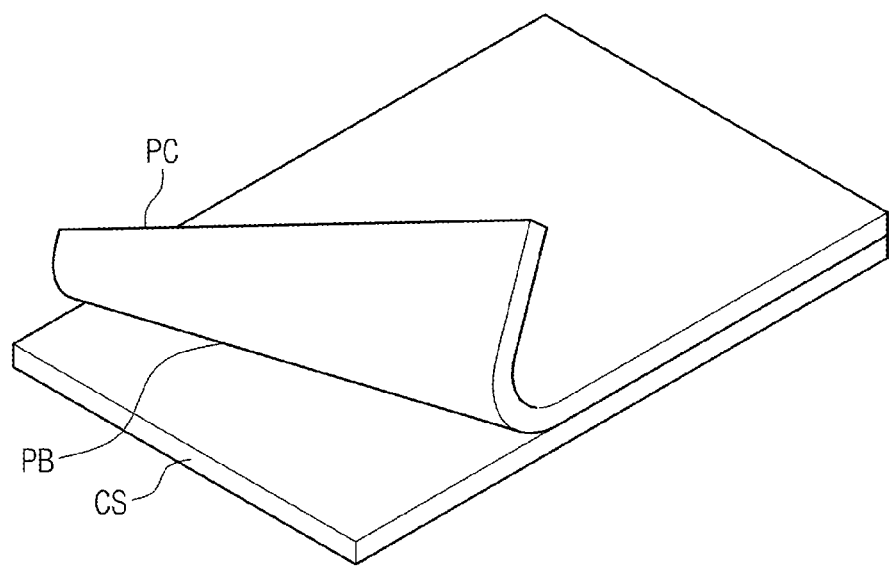
FIG. 4 is a perspective view illustrating an exemplary embodiment of a process of peeling a process substrate from a carrier substrate, according to the invention.
Figure 5:
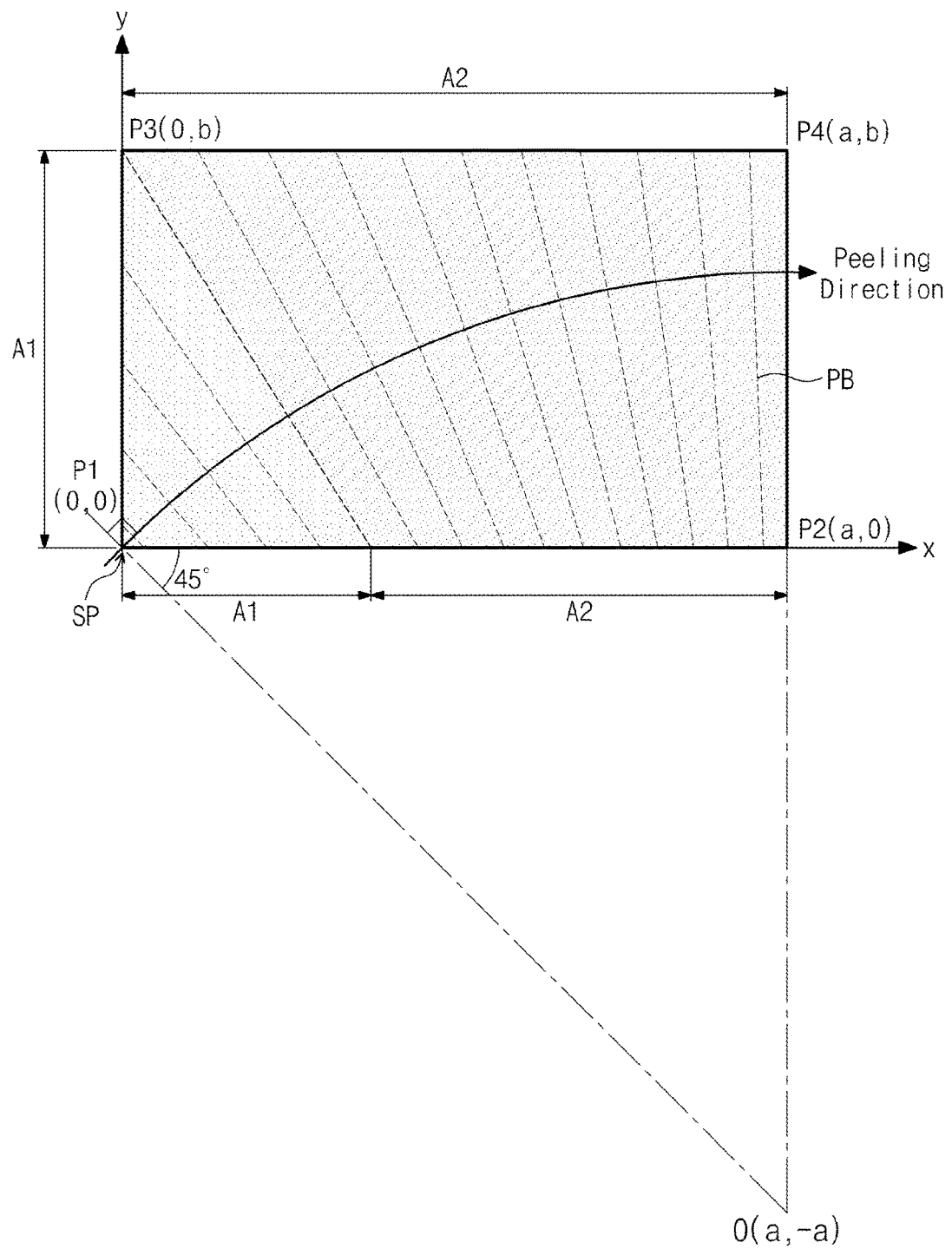
FIG. 5 is a schematic diagram illustrating a trajectory of a vertex clutched by a holder part, when a process substrate is peeled from a carrier substrate, in the process shown in FIG. 4.

FIG. 4 is a perspective view illustrating an exemplary embodiment of a process of peeling a process substrate from a carrier substrate, according to the invention, and FIG. 5 is a schematic diagram illustrating a trajectory of a vertex clutched by a holder part, when a process substrate is peeled from a carrier substrate, in the process shown in FIG. 4.

For convenience of illustration and to provide better understanding of exemplary embodiments of the invention, the peeling apparatus is not illustrated in FIGS. 4 and 5. In an exemplary embodiment, as shown in FIGS. 4 and 5, the process substrate may be provided in the form of a rectangle having two long sides of length a and two short sides of length b and first to fourth vertices that are positioned at first, second, third, and fourth points P1, P2, P3 and P4, respectively. In one exemplary embodiment, for example, the first to fourth vertices are positioned at the first, second, third and fourth points P1, P2, P3 and P4, whose coordinates are represented by (0, 0), (a, 0), (b, 0) and (a, b) in a xy-coordinate system. In an exemplary embodiment, as described above, one of the first to fourth points may be used as the starting point in the peeling process. Hereinafter, for convenience of description, an exemplary embodiment in which the first point (0, 0) is used as the starting point SP will be described in detail.

Referring to FIGS. 4 and 5, in exemplary embodiments, the first vertex is grasped by the holder part and is moved toward a predetermined direction. In an exemplary embodiment, the first vertex is moved by the peeling apparatus in such a way that a trajectory of the first vertex forms a curved line passing through the starting point SP and perpendicularly intersecting the short side (e.g., a segment connecting the second and fourth points P2 and P4) that is spaced apart from the starting point SP, on the xy plane. In such an embodiment, an angle of the trajectory at the starting point SP may be about 45 degrees. In the trajectory, the angle of the trajectory at each point may be positive or negative depending on a position of the starting point and may increase or decrease gradually as being away from the starting point.

Hereinafter, a term of "peeling boundary PB" will be used to represent a boundary of a peeled region on the carrier substrate, which is a boundary between a region of the carrier substrate that is not in contact with the process substrate, and a region of the carrier substrate that is in contact with the process substrate, during the peeling process. A position of the peeling boundary PB may be continuously changed by the movement of the vertex and may be substantially perpendicular to the trajectory. In FIG. 5, the peeling boundary PB is illustrated by a dotted line.

In an exemplary embodiment, the trajectory of the first vertex may be in a shape of a part of a circle. In such an embodiment, the trajectory of the first vertex may be represented by the following formula 1.

$$(x-a)^2+(y+a)^2=2a^2 (0 \leq x \leq a). \quad \text{FORMULA 1:}$$

In the formula 1, the trajectory of the first vertex may be a part (e.g., an arc) of a circle having a center at a position $(a, -a)$ and a radius of $\sqrt{2}a$, for $0 \leq x \leq a$.

Figure 6:
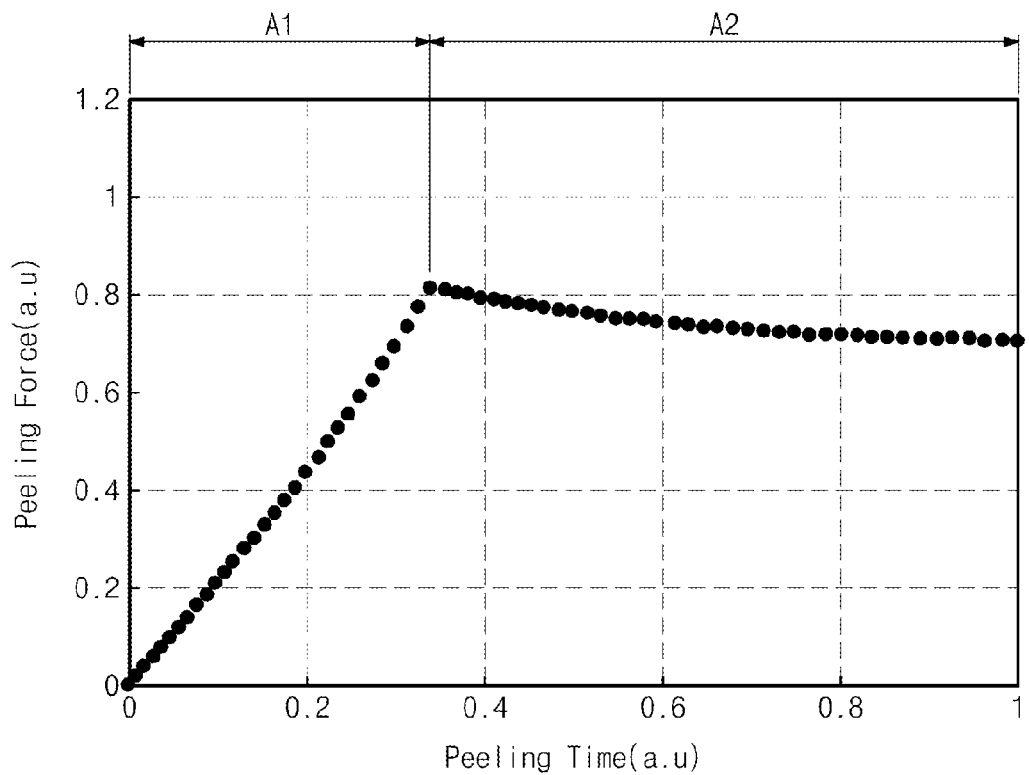
FIG. 6 is a graph showing a peeling force applied to a process substrate, when a process of peeling a process substrate from a carrier substrate is performed using an exemplary embodiment of the method according to the invention.

FIG. 6 is a graph showing a peeling force applied to the process substrate, when the process substrate is peeled from the carrier substrate using an exemplary embodiment of the method including a process of peeling a process substrate from a carrier substrate, according to the invention. In FIG. 6, the x-axis represents a normalized peeling time (arbitrary unit, hereinafter "a.u.") between starting and ending instances of the peeling process, and the y-axis represents a relative peeling force (a.u.) applied to the process substrate at each peeling time. Unit value of the peeling force in FIG. 6 was set based on the maximum peeling force used in a conventional method. The process substrate had an aspect ratio of about 4:3.

Referring to FIGS. 5 and 6, in an exemplary embodiment of the peeling process, characteristics of the peeling force applied to the process substrate were different from each other between a first section A1 and a second section A2. In the first section A1, the peeling force was substantially linearly increased as time went on, while in the second section A2, the peeling force was substantially invariant or was slightly decreased as time went on. The peeling force may be substantially proportional to a length of the peeling boundary PB, shown in FIG. 5, at each instance of the peeling process. That is, the longer the peeling boundary is, the stronger the peeling force is.

In the first section A1, the peeling boundary PB is positioned on a short side adjacent to the starting point SP (for example, a segment connecting the first point P1 with the third point P3) and on a long side adjacent to the starting point SP (for example, a segment connecting the first point P1 with the second point P2). In the second section A2, the peeling boundary PB is positioned on a long side apart from the starting point SP (for example, a segment connecting the third point P3 with the fourth point P4) and the long side adjacent to the starting point SP (for example, the segment connecting the first point P1 with the second point P2). Since the trajectory is substantially perpendicular to the short side apart from the starting point SP (for example, a segment connecting the second point P2 with the fourth point P4) and the peeling boundary is substantially perpendicular to the trajectory, the peeling process may be performed in such a way that the peeling boundary is substantially parallel to the short side apart from the starting point (for example, the segment connecting the second point P2 with the fourth point P4) at the last instance of the peeling process.

Figure 7:
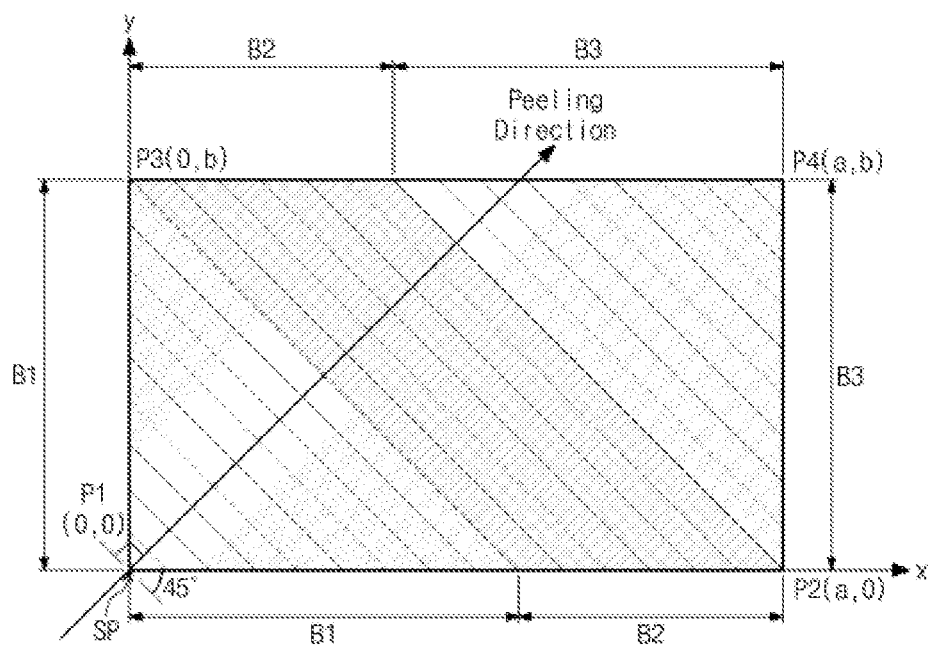
FIG. 7 is a schematic diagram illustrating a trajectory of a vertex clutched by a holder part, when a process substrate is peeled from a carrier substrate using a conventional method.

FIG. 7 is a schematic diagram illustrating a trajectory of a vertex clutched by a holder part, when a process substrate is peeled from a carrier substrate using a conventional method.

Figure 8:
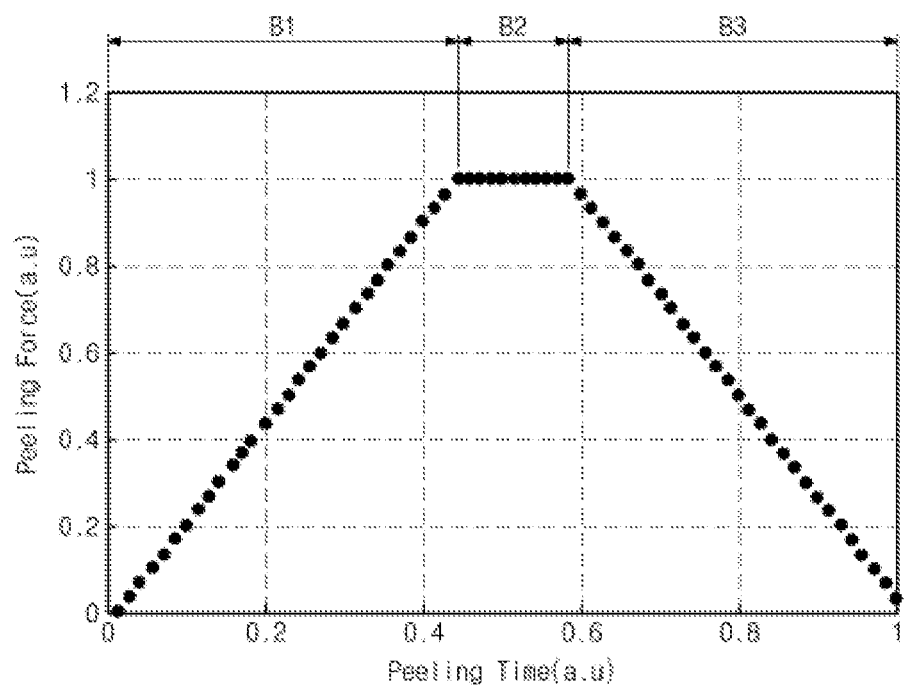
FIG. 8 is a graph showing a peeling force applied to a process substrate, when a process of peeling a process substrate from a carrier substrate is performed using the conventional method.

FIG. 8 is a graph showing a peeling force applied to a process substrate, when a process of peeling a process substrate from a carrier substrate is performed using the conventional method. In FIG. 8, the x-axis represents a normalized peeling time (a.u.) between starting and ending instances of the peeling process, and the y-axis represents a relative peeling force (a.u.) applied to the process substrate at each peeling time. Unit value of the relative peeling force in FIG. 8 was set based on the maximum peeling force in the conventional method. The process substrate had an aspect ratio of 4:3.

Referring to FIGS. 7 and 8, in the conventional method, the peeling force applied to the process substrate in the peeling process were different from each other between three sections (for example, first to third sections B1, B2, and B3). As time went on, the peeling force was substantially linearly increased in the first section B1, was invariant in the second section B2, and was decreased in the third section B3. The peeling force may be substantially proportional to a length of the peeling boundary, shown in FIG. 7, at each instance of the peeling process. That is, the longer the peeling boundary PB is, the stronger the peeling force is.

In the first section B1, the peeling boundary PB may be positioned on a short side adjacent to the starting point SP (for example, the segment connecting the first point P1 with the third point P3) and on a long side adjacent to the starting point SP (for example, the segment connecting the first point P1 with the second point P2). In the second section B2, the peeling boundary PB is positioned on a long side apart from the starting point SP (for example, the segment connecting the third point P3 with the fourth point P4) and on the long side adjacent to the starting point SP (for example, the segment connecting the first point P1 with the second point P2). In the third section B3, the peeling boundary PB is provided on the long side apart from the starting point SP (for example, the segment connecting the third point P3 with the fourth point P4) and on a short side apart from the starting point SP (for example, the segment connecting the second point P2 with the fourth point P4). In the third section B1, the peeling force was the maximum (i.e., the unit value).

Referring back to FIGS. 6 and 8, the maximum of the peeling force was the unit value for the conventional method, and the maximum of the peeling force was about 0.814 in an exemplary embodiment of the method according to the invention. Accordingly, in an exemplary embodiment, the peeling force to be maximally applied to process substrate or carrier substrate may be reduced by about 18.6% compared to a conventional method.

The following TABLE 1 shows peeling forces in the conventional process for peeling the process substrate from the carrier substrate and an exemplary embodiment of a process for peeling the process substrate from the carrier substrate, when a size of the process substrate is changed. The unit value of the peeling force is set to a magnitude of a force required for peeling an about 300 mm×400 mm process substrate from a carrier substrate using the conventional process.

TABLE 1

| Process Substrate Size (mm × mm) | Maximum P.F. in C.P. (relative value) | Maximum P.F. in P.P. (relative value) | Reduction rate in P.F. (%) |
| --- | --- | --- | --- |
| 300 × 400 | 1 | 0.814 | 18.6 |
| 370 × 470 | 1.233 | 0.999 | 19.0 |
| 400 × 500 | 1.333 | 1.079 | 19.1 |
| 550 × 650 | 1.833 | 1.474 | 19.6 |
| 600 × 700 | 2.000 | 1.606 | 19.7 |
| 650 × 830 | 2.167 | 1.757 | 18.9 |
| 680 × 880 | 2.267 | 1.840 | 18.8 |
| 730 × 920 | 2.433 | 1.970 | 19.0 |
| 1000 × 1200 | 3.333 | 2.685 | 19.5 |
| 1100 × 1300 | 3.667 | 2.949 | 19.6 |
| 1300 × 1500 | 4.333 | 3.476 | 19.8 |
| 1500 × 1800 | 5.000 | 4.027 | 19.5 |
| 1870 × 2200 | 6.233 | 5.010 | 19.6 |
| 2160 × 2400 | 7.200 | 5.753 | 20.1 |

P.F.: Peeling Force
C.P.: Conventional Peeling Process
P.P.: Exemplary Embodiment of Peeling Process As shown in the above TABLE 1, in the case where the process substrate was peeled from the carrier substrate using an exemplary embodiment of the peeling process according to the invention, the peeling force was decreased by about 18.6% to about 20.1%, compared with the conventional process, regardless of the size of the process substrate. Accordingly, in an exemplary embodiment, the peeling the process substrate from the carrier substrate may be performed with a reduced peeling force, compared with the conventional peeling process.

As a result, according to exemplary embodiments of the invention, when the process substrate is peeled from the carrier substrate, a strength of a force exerted to the process substrate or the carrier substrate is substantially reduced, and the process substrate may be peeled from the carrier substrate substantially efficiently or effectively without damage to the process substrate.

In an alternative exemplary embodiment, the trajectory of the vertex clutched by a holder part, when the process substrate is peeled from the carrier substrate, may be in a shape of a curve, but not a portion of a circle. The trajectory of the vertex may be in a shape of a curve without any inflection point. In one exemplary embodiment, for example, the trajectory of the vertex may be substantially in a shape of a portion of ellipse. An equation of such an ellipse may be given depending on an aspect ratio of the process substrate. In the case where the trajectory of the vertex is substantially in a shape of a portion of an ellipse, an equation for the ellipse may be given by the following formula 2.

$$\frac{(x-a)^2}{p^2} + \frac{(y+a)^2}{q^2} = 2a^2$$ FORMULA 2

In exemplary embodiments, the peeling boundary may be positioned on the long side apart from the starting point SP (for example, the segment connecting the third point P3 with the fourth point P4) and on the long side adjacent to the starting point SP (for example, the segment connecting the first point P1 with the second point P2).

Figure 9:
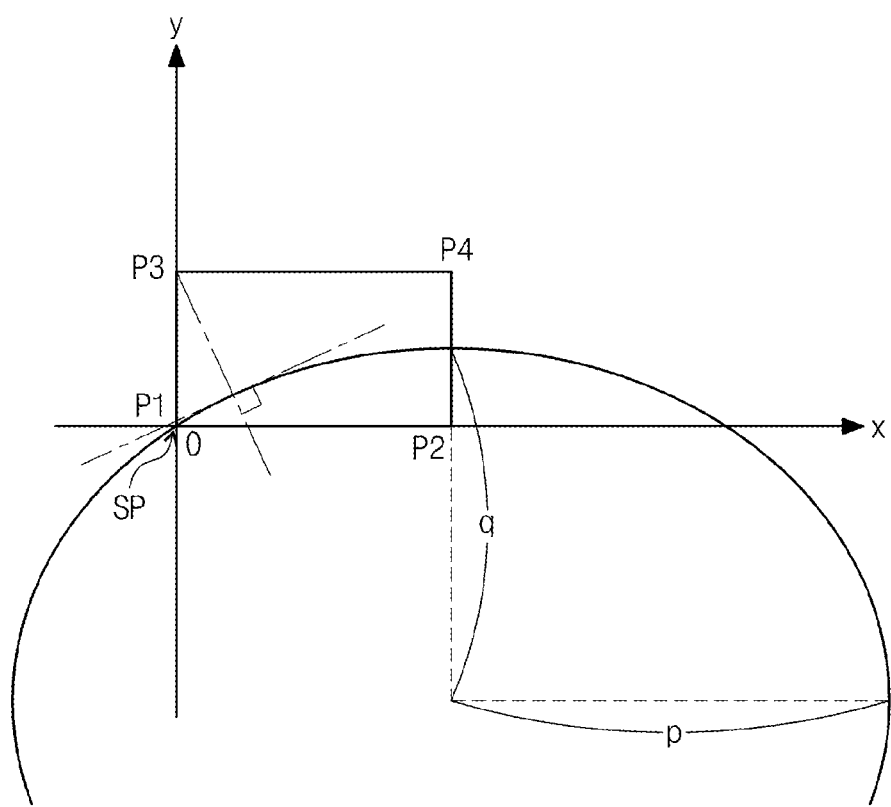
FIG. 9 is a diagram showing a trajectory of a first vertex represented in the xy-coordinate system, when a long side of a process substrate has a direction parallel to a major axis of an ellipse.

FIG. 9 is a graph showing a trajectory of the vertex represented in the xy-coordinate system, when a long side of a process substrate is in a direction substantially parallel to a major axis of an ellipse. In the ellipse of FIG. 9, a length of the major axis parallel to the x-axis is 2p, and a length of the minor axis is 2q, where $p \neq 0$, $q \neq 0$, and $p \neq q$. In one exemplary embodiment, for example, the ellipse of FIG. 9 may satisfy the condition of $q/p<1$, and in such an embodiment, a curve of the trajectory of the vertex may allow for minimizing the maximum peeling force.

In the case of $q/p>1$, the peeling boundary may not be positioned on the long side apart from the starting point SP (for example, the segment connecting the third point P3 with the fourth point P4) and on the long side adjacent to the starting point SP (for example, the segment connecting the first point P1 with the second point P2). In such a case, a tangent line to the ellipse may have a slope of about 1 or less, when passing through the third point P3. In this case, the peeling boundary may not be positioned on the long side spaced apart from the starting point (for example, the segment connecting the third point P3 with the fourth point P4) and on the long side adjacent to the starting point (for example, the segment connecting the first point with the second point). A line normal to the tangent line may represent the peeling boundary passing through the intersection point between the normal and tangent lines. The case where the slope of the tangent line is about 1 or less may be represented by the following formula 3.

$$\frac{q}{p} < \sqrt{\frac{a+b}{a}}$$ FORMULA 3

A method of obtaining the solution of the formula 3 will now described with reference to FIG. 10.

Figure 10:
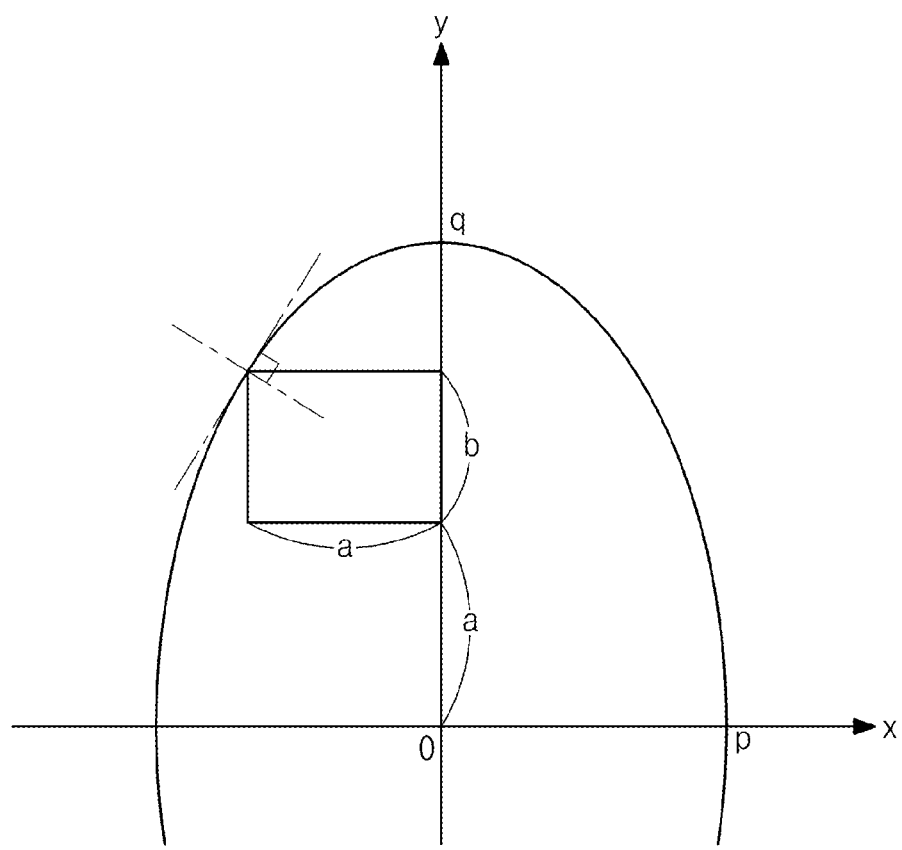
FIG. 10 is a diagram showing parallel translated disposition of the process substrate relative to the ellipse with a center positioned at the origin.

FIG. 10 is a diagram showing parallel translated disposition of the process substrate relative to the ellipse with a center positioned at the origin. In FIG. 10, the ellipse is moved in such a way that a center thereof is positioned at the origin (0, 0) of the coordinate system and foci thereof are positioned on the y-axis, and the process substrate is moved in such a way that the third point thereof is positioned on the moved ellipse, and then, a slope of the ellipse at the third point of the process substrate is calculated. Referring to FIG. 10, the ellipse may be expressed by the following formula 4, and the slope of the ellipse may be given by the following formula 5.

$$\frac{x^2}{p^2} + \frac{y^2}{q^2} = 2a^2. \qquad \text{FORMULA 4}$$

$$-\frac{q^2 x}{p^2 y} < 1. \qquad \text{FORMULA 5}$$

From the formula 5, the slope at the third point (−a, a+b) of the process substrate is given by the following formula 6.

$$\frac{q^2 a}{p^2 (a+b)} < 1, \text{ and} \qquad \text{FORMULA 6}$$

$$\frac{q}{p} < \sqrt{\frac{a+b}{a}}.$$

Based on the above formula for the ellipse, in an exemplary embodiment, the vertex may move along the trajectory satisfying the conditions of $$\frac{q}{p} > 1 \text{ and } \frac{q}{p} < \sqrt{\frac{a+b}{a}},$$

such that the maximum peeling force is substantially reduced.

As described above, according to exemplary embodiments of the invention, when the process substrate is peeled from the carrier substrate, magnitude of a force exerted to the process substrate or the carrier substrate is substantially reduced the process substrate from the carrier substrate may be peeled effectively or efficiently without damage to the process substrate.

While exemplary embodiments of the inventions have been particularly shown and described, it will be understood by one of ordinary skill in the art that variations in form and detail may be made therein without departing from the spirit and scope of the attached claims.

What is claimed is:

1. A method of fabricating a device, the method comprising:
providing a process substrate on a carrier substrate, wherein the process substrate has a rectangular shape with a pair of long sides and a pair of short sides;
providing a device on the process substrate;
continuously peeling the process substrate from the carrier substrate by moving one of vertices of the process substrate with a curved trajectory in a plan view, such that the one of vertices of the process substrate passes perpendicularly through one of the short sides of the process substrate in the plan view,
wherein the one of vertices of the process substrate is spaced apart from the one of short sides of the process substrate before the peeling the process substrate.

2. The method of claim 1, wherein a boundary of a peeled region of the carrier substrate during the peeling of the process substrate from the carrier substrate is substantially perpendicular to the curved trajectory.

3. The method of claim 2, wherein the curved trajectory is a part of a circle.

4. The method of claim 3, wherein
when, in an xy-coordinate system, the vertices of the process substrate are located at positions (0, 0), (a, 0), (b, 0) and (a, b), respectively, and the one of vertices of the process substrate is located at the position (0, 0), the curved trajectory is given by the following equation:

$(x-a)2+(y+a)2=2a^2$, where $a>b$ and $0 \leq x \leq a$.

5. The method of claim 2, wherein the curved trajectory is a part of an ellipse.

6. The method of claim 5, wherein
when, in an xy-coordinate system, the vertices of the process substrate are located at positions (0, 0), (a, 0), (b, 0) and (a, b), respectively, and the one of vertices of the process substrate is located at the position (0, 0), the curved trajectory is given by the following equation:

$$\frac{(x-a)^2}{p^2} + \frac{(y+a)^2}{q^2} = 2a^2,$$

where p≠0, q≠0, p≠q, 0≤x≤a, and $$\frac{q}{q} < \sqrt{\frac{a+b}{a}}$$

for $$\frac{q}{p} > 1.$$

7. The method of claim 1, wherein each of the process and carrier substrates comprises glass or a polymer.

8. The method of claim 7, wherein the polymer comprises at least one of polyethylene terephthalate, polyethylene naphthalate, poly(ether sulfone), polycarbonate, polysulfone, phenolic resin, epoxy resin, polyester, polyimide, polyetherester, polyetheramide, cellulose acetate, aliphatic polyurethanes, polyacrylonitrile, polytetrafluoroethlenes, polyvinylidene fluorides, poly(methyl(methacrylates)), aliphatic or cyclic polyolefin, polyarylate, polyetherimide, polyimide, fluoropolymer, poly(ehterether ketone), poly (ether ketone), poly(ethylene tetrafluoroethylene) fluoropolymer, poly(methyl methacrylate), and acrylate/methacrylate copolymers.

9. The method of claim 7, wherein one of the process and carrier substrates further comprises an inorganic thin-film provided thereon.

10. The method of claim 7, wherein one of the process and carrier substrates further comprises a resin thin-film provided thereon.

11. The method of claim 1, wherein the process substrate has a thickness of about 0.3 millimeter or less.

12. The method of claim 11, wherein the carrier substrate has a thickness of about 0.3 millimeter or greater.

13. The method of claim 1, further comprising:
separating a portion of the process substrate near the one of vertices of the process substrate from the carrier substrate, before the continuous peeling of the process substrate from the carrier substrate.

14. The method of claim 13, wherein the separating of the portion of the process substrate from the carrier substrate comprises inserting a blade into an interface between the process and carrier substrates.

* * * * *